US006919769B2

(12) United States Patent
Lim et al.

(10) Patent No.: US 6,919,769 B2
(45) Date of Patent: Jul. 19, 2005

(54) METHOD AND APPARATUS FOR FAST LOCK ACQUISITION IN SELF-BIASED PHASE LOCKED LOOPS

(75) Inventors: Chee How Lim, Hillsboro, OR (US); Keng L. Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 10/670,828

(22) Filed: Sep. 24, 2003

(65) Prior Publication Data

US 2005/0062548 A1 Mar. 24, 2005

(51) Int. Cl.[7] .............................. H03L 7/087; H03L 7/10
(52) U.S. Cl. ............................... 331/17; 331/1 A; 331/8; 331/11; 331/25; 331/173; 327/157
(58) Field of Search ...................... 331/1 A, 8, 10–12, 331/16–18, 25, DIG. 2, 173; 327/156–159; 332/127; 360/51; 375/376; 455/260

(56) References Cited

U.S. PATENT DOCUMENTS

| | | | |
|---|---|---|---|
| 5,630,107 A | 5/1997 | Carmean et al. | |
| 6,104,771 A | * 8/2000 | Soda | ........................... 375/376 |
| 6,157,206 A | 12/2000 | Taylor et al. | |
| 6,211,740 B1 | 4/2001 | Dai et al. | |
| 6,298,105 B1 | 10/2001 | Dai et al. | |
| 6,320,424 B1 | 11/2001 | Kurd et al. | |
| 6,326,802 B1 | 12/2001 | Newman et al. | |
| 6,351,136 B1 | 2/2002 | Jones et al. | |
| 6,411,122 B1 | 6/2002 | Mughal et al. | |
| 6,424,170 B1 | 7/2002 | Raman et al. | |
| 6,509,780 B1 | 1/2003 | Lim et al. | |
| 6,522,165 B2 | 2/2003 | Ramachandran et al. | |
| 6,535,047 B2 | 3/2003 | Mughal et al. | |
| 6,545,522 B2 | 4/2003 | Mughal et al. | |
| 6,587,800 B1 | 7/2003 | Parker et al. | |
| 6,614,317 B2 | 9/2003 | Wong et al. | |
| 6,717,455 B2 | 4/2004 | Mughal et al. | |
| 6,748,549 B1 | 6/2004 | Chao et al. | |
| 6,756,810 B2 | 6/2004 | Mughal et al. | |
| 6,771,134 B2 | 8/2004 | Wong et al. | |

* cited by examiner

*Primary Examiner*—David Mis
(74) *Attorney, Agent, or Firm*—Schwabe, Williamson & Wyatt, P.C.

(57) ABSTRACT

A self-biased phase locked loop (PLL) circuit includes a charge pump to generate a control voltage, a controlled oscillator coupled to the charge pump to generate the output signal based at least in part upon the control voltage, discharge circuitry coupled to the charge pump to discharge the control voltage, and frequency detection circuitry coupled to the controlled oscillator and the discharge circuitry to generate a digital feedback signal for terminating discharge of the control voltage by the discharge circuitry when the output signal reaches a threshold frequency that is a fraction of the target frequency.

20 Claims, 6 Drawing Sheets

METHOD AND APPARATUS FOR FAST LOCK ACQUISITION IN SELF-BIASED PHASE LOCKED LOOPS

BACKGROUND

1. Technical Field of the Invention

The present invention relates generally to phase-locked loop circuits, and more specifically, to self-biased phase-locked loop circuits.

2. Background Information and Description of Related Art

Phase-locked loops or "PLLs" have been widely used in data communications, local area networks, microprocessors, and data storage applications to generate secondary clock signals based upon a given reference signal. Generally, PLLs are considered to be either self-biased or non self-biased. Non self-biased PLLs typically use discrete circuitry requiring no a priori relationships between the various components of the PLLs other than having common interfaces. However due to their discrete nature, devices in a non self-biased PLL can independently vary potentially causing problems with tracking.

In contrast, self-biased PLLs utilize devices whose performances are intricately linked such that when one parameter of one device varies, the PLL automatically adjusts other devices to compensate for the change. Although this provides for better tracking than that available from non self-biased PLLs, self-biased PLLs typically require additional startup circuitry not required by non self-biased PLLs to jumpstart analog circuitries in transitioning from a stable zero-current state to a correct operating point.

FIG. 1 illustrates one example of a conventional self-biased phase-locked loop 100. Conventional PLLs, such as PLL 100, generally include a phase-frequency detector (PFD) 102 for monitoring a phase difference between a reference signal 104 and a feedback signal in the form of a frequency divided output signal (VCO Clk 106) of a voltage-controlled oscillator (VCO) 126. The PFD 102 generates an UP control signal 110 and a DOWN control signal 112 to cause a charge pump 114 to respectively charge and discharge a loop filter 116. The loop control voltage 118 developed across the loop filter 116 determines the output frequency of the VCO 126. Furthermore, the UP and DOWN control signals 110, 112 driving the charge pump 114 set the proper loop filter control voltage 118 to maintain a minimal phase error between the input signals applied to the PFD 102. Additionally, the bias generator 120 generates two bias voltages, V$_{BN}$ 122 and V$_{BP}$ 124. V$_{BN}$ 122 controls the VCO 126 and the charge pump 114 to facilitate self-biasing of the PLL, while V$_{BP}$ 124 functions as the control voltage of the VCO 212.

In PLLs, such as PLL 100 that utilize controlled oscillators such as VCO 126, the frequency of the target output signal from the PLL typically depends upon the frequency of the signal output by the controlled oscillator. Operation of such controlled oscillators is typically influenced or controlled by what is referred to as a control voltage. In general, as the control voltage decreases, the output frequency of the PLL increases, and as the control voltage increases, the output frequency of the PLL decreases. In the past, self biased PLLs were jumpstarted by configuring the PLL such that the control voltage would always be pulled down to one-half of the supply voltage by e.g. startup circuitry 128. After reaching one-half the supply voltage, the PLL would be allowed to operate freely so as to acquire a lock based upon the reference signal.

Although such a configuration might work successfully for single fixed voltages, such conventional jumpstart circuitries fail across multiple operating voltages. For example, when a one-volt supply voltage is pulled to what is referred to as "half-rail" (e.g. one-half of the supply voltage or 500 mV in this case), a PLL that requires 300 mV–400 mV to turn on may function properly. However, when the same PLL is placed in a system such as a microprocessor operating at a fixed or reduced voltage level of 700 mV (or 0.7 volts), the same PLL may not function properly since the resulting half-rail voltage of 350 mV is not large enough to turn on the PLL devices. Although startup voltages could be set artificially high, doing so would result in extremely long PLL lock times.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF ILLUSTRATED EMBODIMENTS

In the following detailed description, numerous specific details are set forth in order to provide a thorough understanding of embodiments of the present invention. However, those skilled in the art will understand that such embodiments may be practiced without these specific details. In other instances, well known methods, procedures, components, and circuits have not been described in detail.

Although various discrete operations will be described herein, the mere order of description should not be construed as to imply that these operations are necessarily performed in the order they are presented.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments. Lastly, the terms "comprising", "including", "having", and the like, as used in the present application, are intended to be synonymous.

Figure 2:
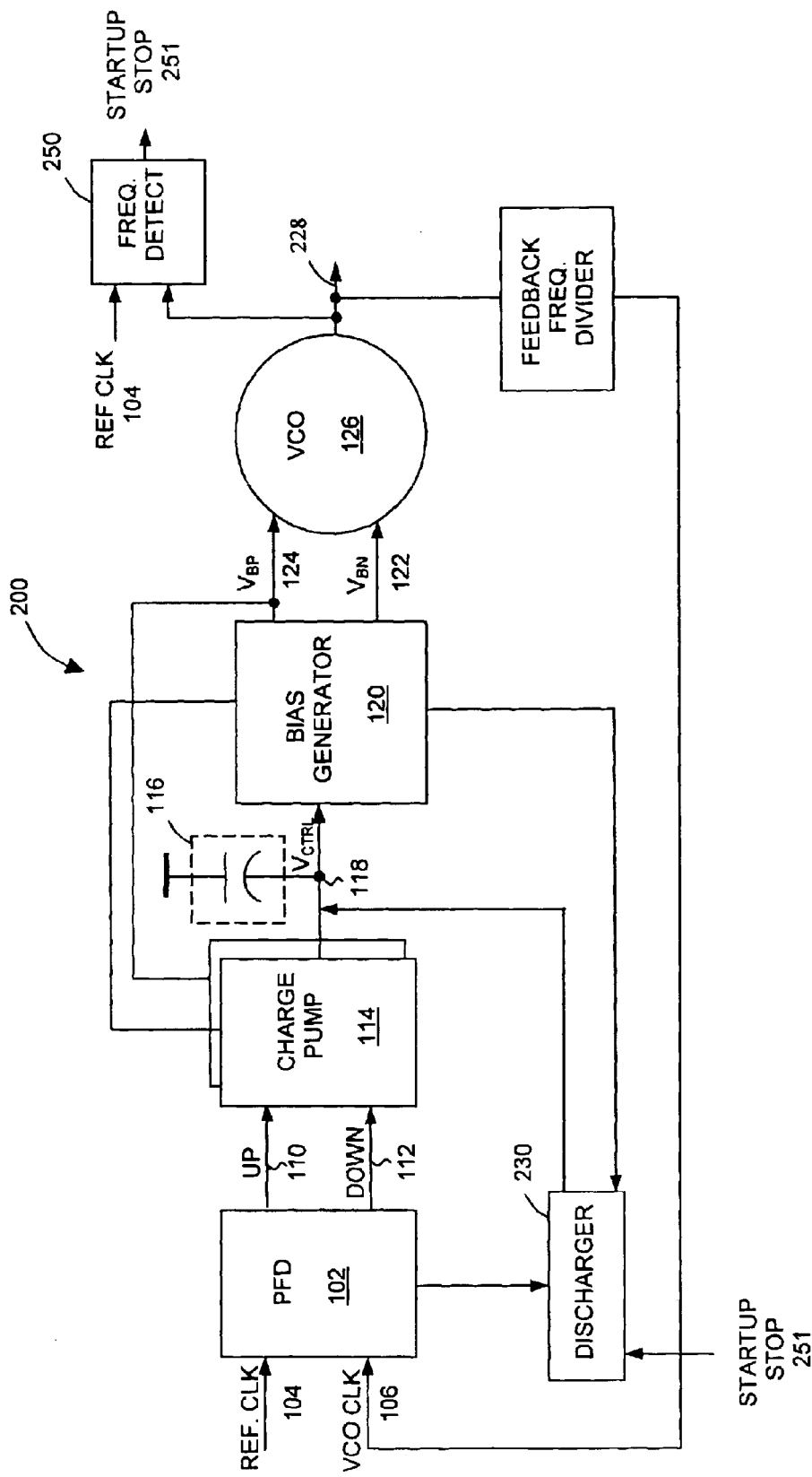
FIG. 2 illustrates an overview of a self-biased PLL in accordance with embodiments of the present invention.

FIG. 2 illustrates an overview of a self-biased PLL in accordance with embodiments of the present invention. As shown, self-biased PLL 200 includes PFD 102, charge pump 114, loop filter 116, bias generator 120, and VCO 126. As with PLL 100, PFD 102 may monitor phase differences between a reference signal 104 and a feedback signal (VCO Clk 106), and may generate an UP or DOWN control signal (110,112) to cause the charge pump 114 to charge and discharge the loop filter 116 based upon those phase differences. The bias generator 120 may generate a first bias voltage ($V_{BN}$ 122) that controls the VCO 126 and the charge pump 114 to facilitate self-biasing of the PLL 200, and a second bias voltage ($V_{BP}$ 124) that functions as the control voltage of the VCO 212. Although self-biased PLL 200 is shown to include a voltage controlled oscillator (e.g. VCO 126), self-biased PLL 200 may nonetheless include any type of controlled oscillator such as a current controlled oscillator (ICO) without departing from the spirit and scope of the disclosure. In the event self-biased PLL 200 includes an ICO, self-biased PLL 200 may further include a voltage-to-current converter communicatively coupled between the charge pump 114 and the ICO.

In the illustrated embodiment of FIG. 2, self-biased PLL 200 is additionally equipped with discharger circuitry 230 and frequency detection circuitry 250 to advantageously provide self-biased PLL 200 with, for example, an improved startup process having reduced power-up latency and decreased susceptibility to process variations as compared to prior art PLL designs. In one embodiment, the discharger circuitry 230 discharges the control voltage 118, which in turn causes self-biased PLL 200 to wake up and generate an output signal 228 having a frequency that increases to match a target output frequency. Frequency detection circuitry 250 monitors the frequency of the output signal 228, and indicates to discharger circuitry 230 to terminate discharging the control voltage 118 once a threshold frequency is reached. Once the startup phase of self-biased PLL's 200 operation is terminated, the PLL is able to acquire frequency lock naturally and in a predicable manner. In one embodiment, the frequency detection circuitry 250 employs digital devices to determine the threshold frequency as a fraction of a target output frequency to be output by self-biased PLL 200 (e.g. via output signal 228). By terminating the startup process after the threshold frequency has been reached, but prior to the target output frequency being achieved, the power-up latency of the PLL can be reduced while preventing frequency overshoot (e.g. frequency runaway) conditions associated with prior art PLL designs. Furthermore, due at least in part to the digital nature of frequency detection circuitry 250, self-biased PLL 200 scales well from one process generation to the next.

Figure 3:
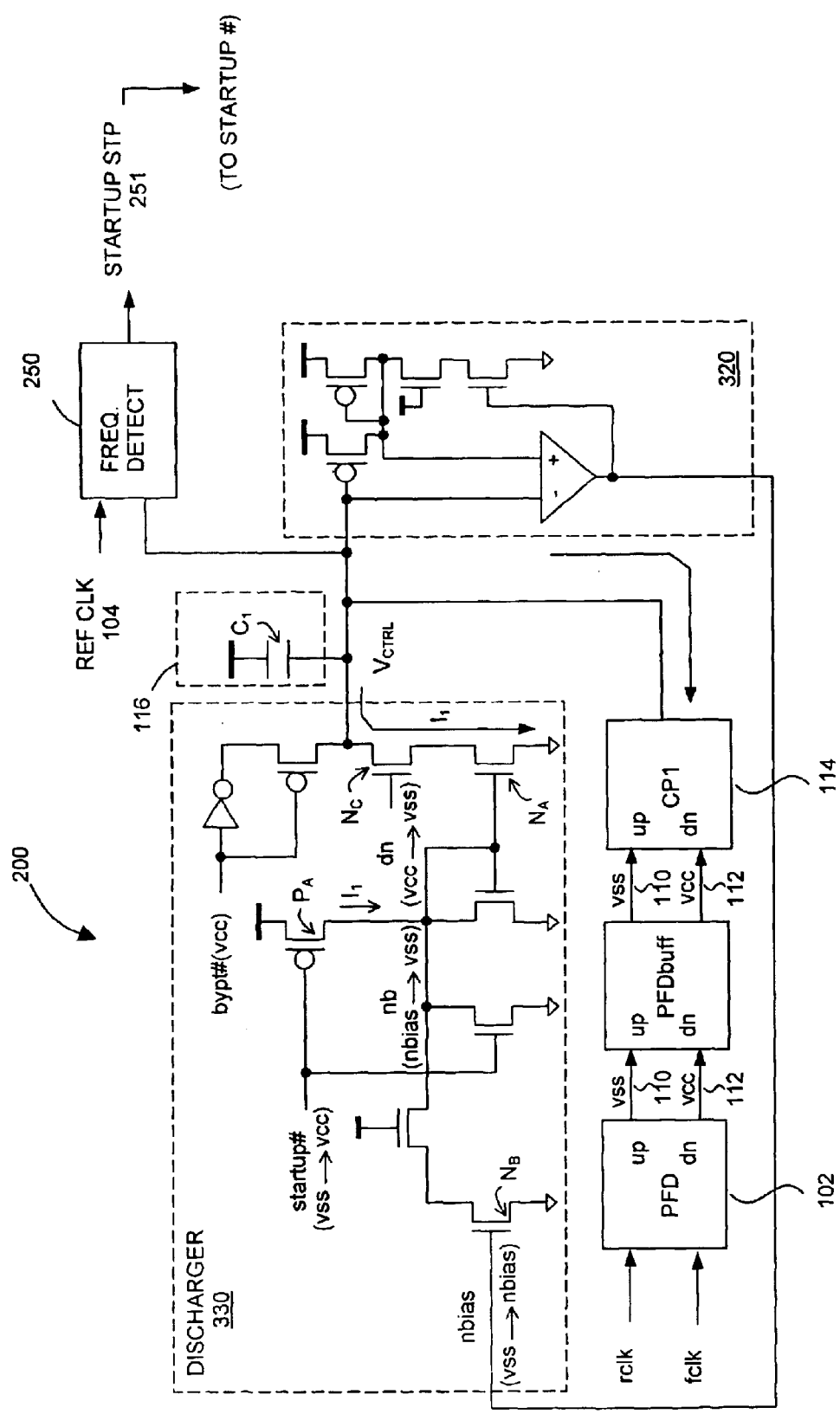
FIG. 3 illustrates a more detailed view of self-biased PLL 200 including discharger circuitry 330 and replica bias circuitry 320 in accordance with one embodiment of the invention.

FIG. 3 illustrates a more detailed view of self-biased PLL 200 including disharger circuitry 330 and replica bias circuitry 320 in accordance with one embodiment of the invention. The replica bias circuitry 320 may, for example, represent circuitry preexisting in bias generator 120. In one embodiment, the replica bias circuitry 320 generates an analog NBIAS signal which is coupled to discharger circuitry 330 in a feedback arrangement. At startup, the DN signal from PFD 102 is typically at Vcc or supply voltage causing Field Effect Transistor (FET) Nc to "turn on". Furthermore, because STARTUP# is enabled at a low logic level during startup, FET $P_A$ is also turned on allowing current I1 (which need not be a precision current source) to flow through FET $P_A$. In turn, FET $N_A$ is also turned on causing the mirroring of I1 and the corresponding discharge of $V_{CTRL}$ through devices Nc and $N_A$. As $V_{CTRL}$ continues to be discharged, the frequency of output signal 228 increases causing the voltage level of NBIAS to also begin to increase.

In one embodiment, once the frequency detector 250 determines that self-biased PLL 200 has reached a threshold frequency, the frequency detector 250 asserts STARTUPSTP signal 251 which causes STARTUP# to transition to Vcc thereby causing FET $P_A$ to effectively turn off. At the same time, NBIAS continues to increase as the frequency of output signal 228 continues to increase. As such, FET $N_B$ will begin to turn on effectively pulling the voltage nB down towards ground. As this happens FET $N_A$ transitions off causing the flow of current I1 and corresponding discharge of the control voltage $V_{CNTRL}$, which further facilitates leakage current reduction over prior art PLLs. By turning off the current flow I1, the charge pump 114 effectively acts to drive the loop filter 116 rather than the startup circuitry including discharger circuitry 330. Thereafter, self-biased PLL 200 may operate freely to approach the target output frequency.

Figure 4A:
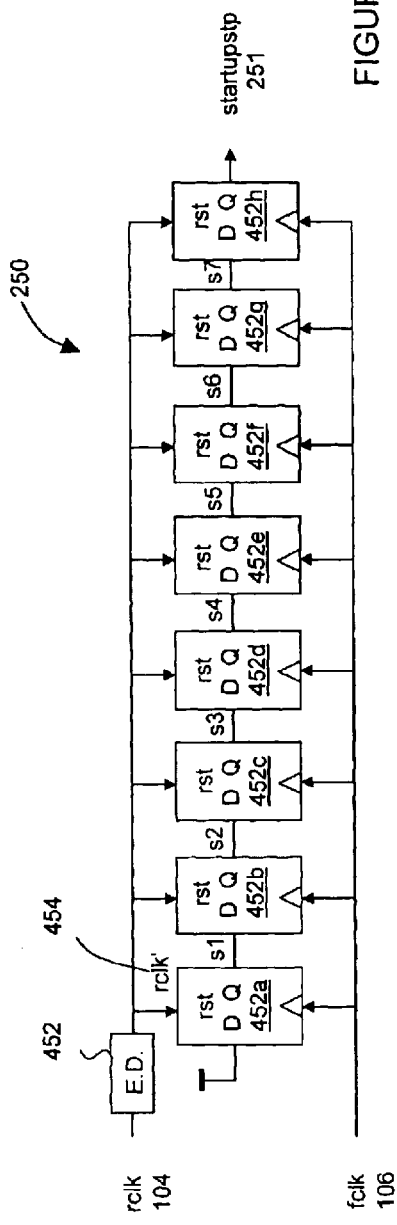
FIGS. 4A–C illustrate one embodiment of the frequency detection circuitry 250 of self-biased PLL 200 and associated timing diagrams.
Figure 4B:
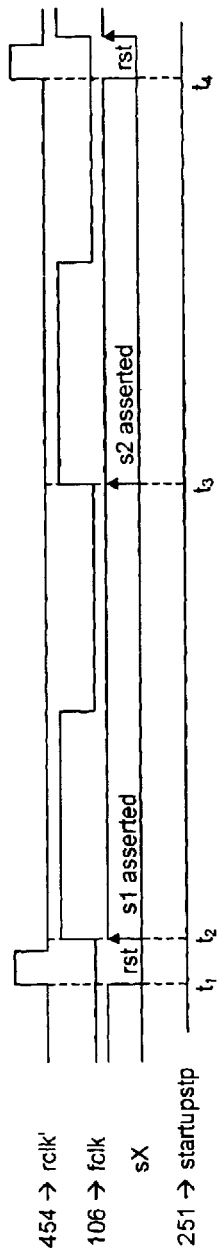
Figure 4C:
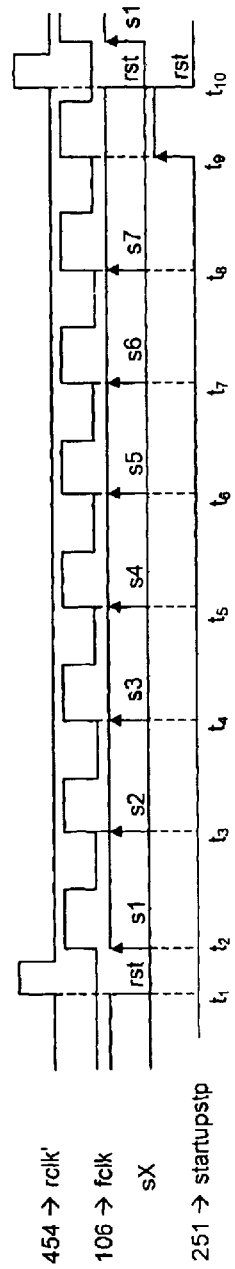

FIGS. 4A–C illustrate one embodiment of the frequency detection circuitry 250 of self-biased PLL 200 and associated timing diagrams. In one embodiment, the frequency detection circuitry 250 represents digital logic that is equipped to detect a threshold number of clock edges, and assert a STARTUPSTP signal when that threshold number of edges is reached. In one embodiment the threshold number of edges is programmable and may be determined based upon a number of factors including maximum and/or minimum system bus speeds, tolerable power-up latency and so forth. In the illustrated embodiment of FIG. 4A, the frequency detection circuitry 250 is configured to assert STARTUPSTP signal 251 when eight (8) clock edges of VCO clock signal (VCO Clk) 106 are detected within a single reference clock signal (rclk) 104.

As shown, frequency detection circuitry 250 includes eight D-type flip-flop devices (452a–452h) coupled sequentially together to form a chain of flip-flop circuits. The point of connection between the various circuits and devices described herein may be referred to as an input, output, terminal, and a line, or similar variants and combinations thereof.

These terms are considered equivalent for the purpose of this disclosure. In frequency detection circuitry 250, the output terminal (Q) from each but the first and last flip-flops is coupled to the data or input terminal (D) of the next flip-flop. Additionally, the input of the first flip-flop (452a) in the chain is coupled to a power supply node and the output of the last flip-flop (452h) in the chain is coupled to discharger circuitry 330 of FIG. 3. Furthermore, each of the clock inputs of flip-flops 252a–252h are coupled to VCO Clk 106, whereas each of the reset inputs (rst) of the flip-flops are coupled to rclk' 454 which may be derived from rclk 104 via edge detection circuitry 452. Thus, for each rising clock edge detected by flip-flops 452a–452h, an input value of "1" (e.g. due to the data input of flip-flop 452 being tied to Vcc) is asynchronously passed from one flip-flop to the next until either the signal is passed through all flip-flops so as to generate STARTUPSTP signal 251, or a rising clock edge is detected on rclk' 454 that resets all the flip-flops.

FIG. 4B is a timing diagram illustrating the operation of the frequency detection circuitry 250 during the startup phase of self-biased PLL 200 in accordance with one embodiment of the invention. In FIG. 4B, all flip-flops (e.g. as indicated by sX) are reset at time t1 in coordination with the rising edge of rclk' 454. At time t2, the output of flip-flop s1 becomes asserted with the rising edge of VCO Clk 106. At t3, the output of s2 becomes asserted again with the rising edge of VCO Clk 106. However, at time t4, another rising edge is detected on rclk' 454 causing the outputs of s1 and s2 to be reset.

FIG. 4C is a timing diagram illustrating the operation of the frequency detection circuitry 250 during the termination phase. As shown, the outputs of each of flip-flops s1, s2, s3, s4, s5, s6, and s7 are sequentially asserted for each rising edge detected on VCO Clk 106. At time t9, STARTUPSTP signal 251 is asserted as the eighth rising edge of flip-flop s8 is asserted prior to a second rising edge of rclk' 454 being detected at time t10.

Figure 5:
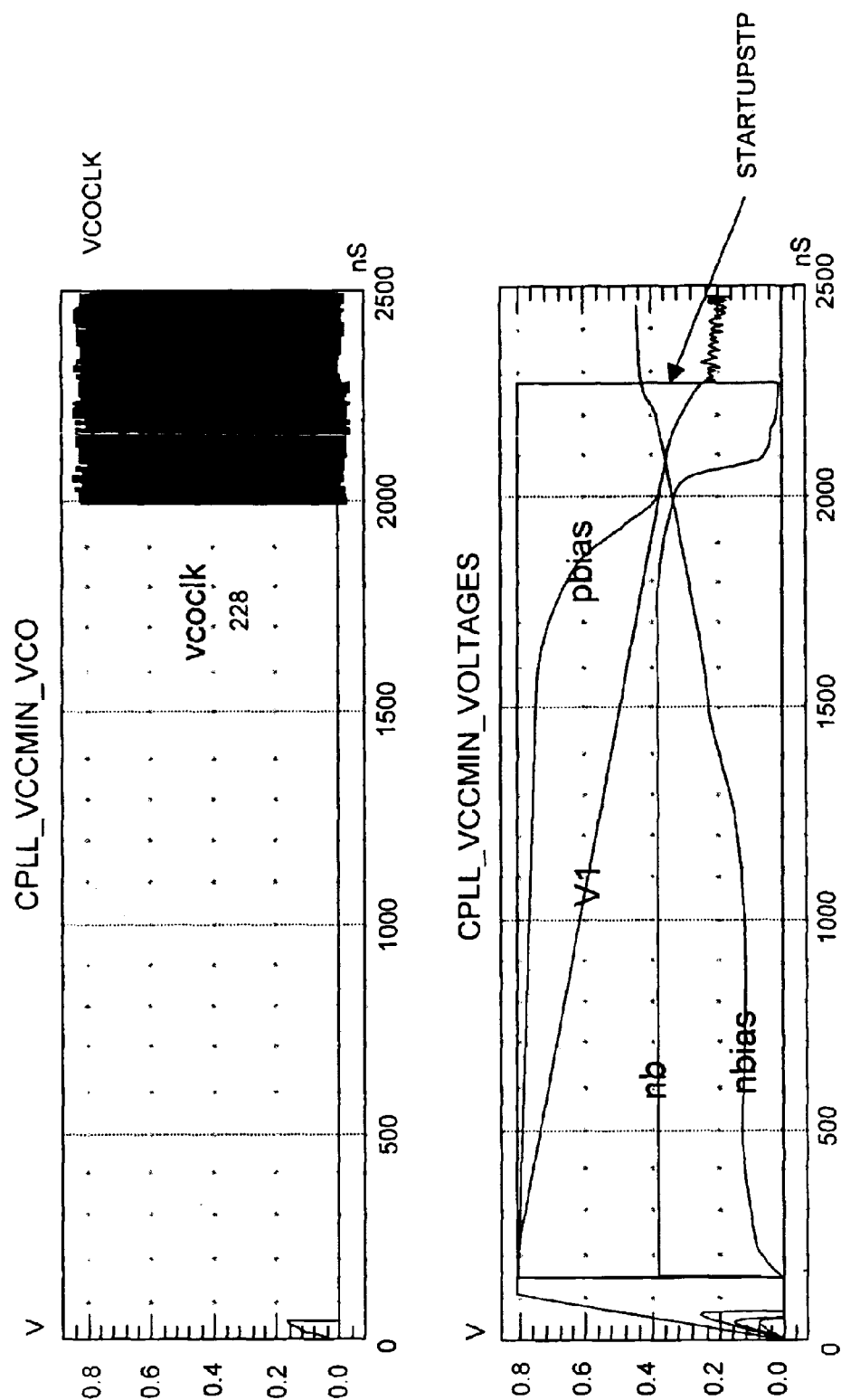
FIG. 5 is a voltage vs. time simulation graph illustrating interrelationships between various signals/voltages of PLL 200, in accordance with one embodiment.

FIG. 5 is a voltage vs. time simulation graph illustrating interrelationships between various signals/voltages of PLL 200, in accordance with one embodiment. More specifically, FIG. 5 illustrates the relative voltages of the pbias, V1, nb, and nbias nodes of PLL 200 with respect to progression of time. In particular, V$_{CTRL}$ represents the control voltage associated with loop filter 116 while pbias represents the control voltage of the VCO 212 (e.g. V$_{BP}$ 124). It can further be seen that V$_{CTRL}$ is ramped down in a linear fashion due to discharger 230. Furthermore, as self-biased PLL 200 begins to "wake up" pbias approaches V$_{CTRL}$. Whenever nb (the internal node shown on FIG. 3) is high (e.g. approx. 0.4 volts on FIG. 5), transistor N$_A$ is turned on and I1 continues to discharge. So, as Vctrl decreases nbias starts to increase, and when nbias increases enough, it acts to pull nb node to ground. When the nb node is disharged, the discharger current I1 terminates itself. At this point the frequency of the output signal (vcoclk 228 in FIG. 5) begins to ramp up. Once a threshold frequency (e.g. as determined by frequency detection circuitry 250) is reached, the STARTUPSTP signal is asserted effectively terminating the startup phase of the self-biased PLL. At this point self-biased PLL 200 starts to acquire lock by itself.

Figure 6:
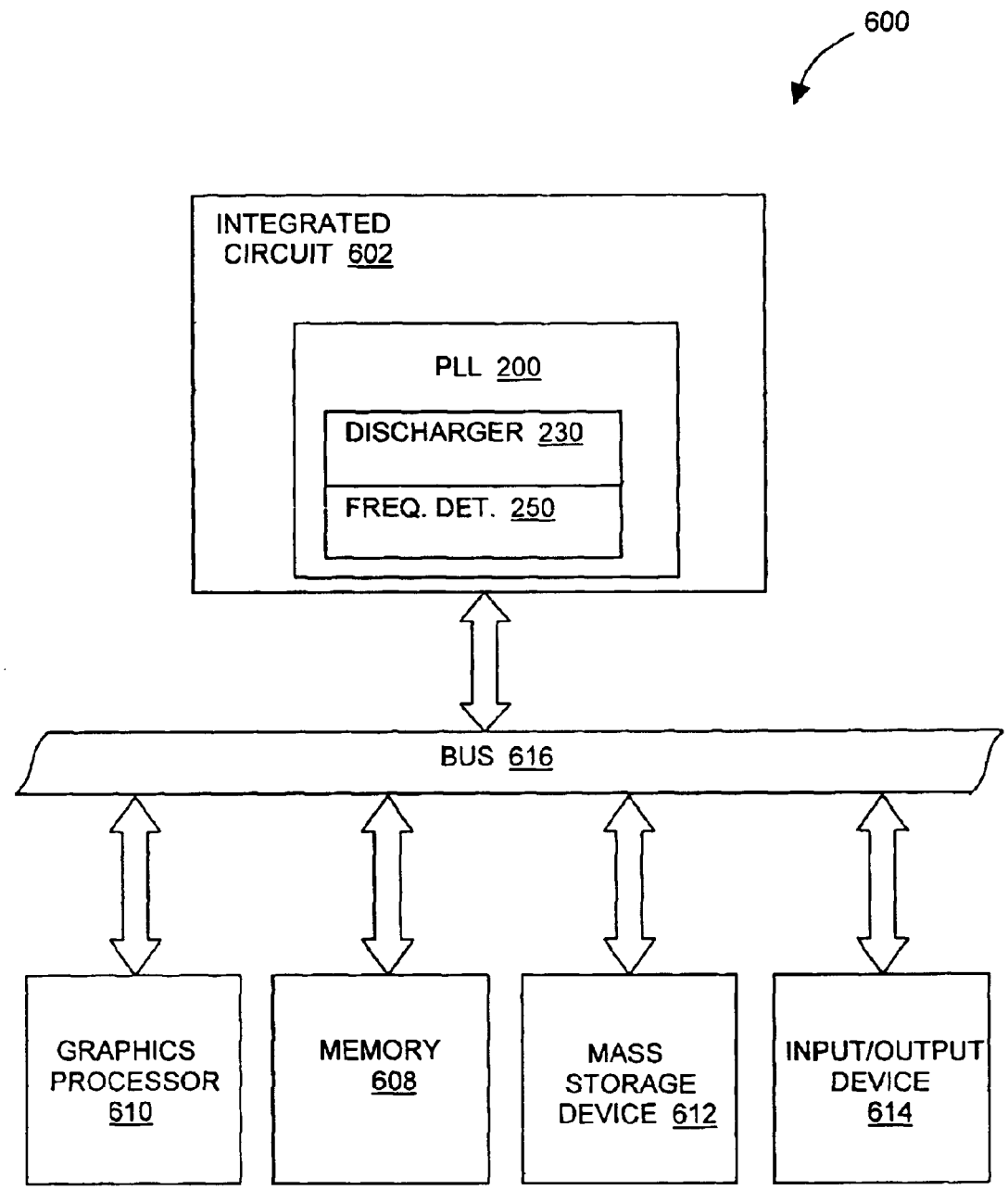
FIG. 6 illustrates is a block diagram of a computer system 600 including a self-biased PLL incorporated with the improved startup circuitry in accordance with one or more embodiments of the present invention.

Referring to FIG. 6, there is illustrated one of many possible systems in which a PLL circuit 200 incorporated with the discharger 230 and frequency detection circuitry 250 may be used. In one embodiment, PLL 200 is implemented in an integrated circuit (IC) 602. In one embodiment, IC 602 may be a microprocessor. In alternate embodiments, IC 602 may be an application specific IC (ASIC).

In the illustrated embodiment, system 600 also includes a main memory 608, a graphics processor 610, a mass storage device 612 and an input/output module 614 coupled to each other by way of a bus 616, as shown. Examples of the memory 608 include but are not limited static random access memory (SRAM) and dynamic random access memory (DRAM). Examples of the mass storage device 612 include but are not limited to a hard disk drive, a compact disk drive (CD), a digital versatile disk driver (DVD), and so forth. Examples of the input/output modules 614 include but are not limited to a keyboard, cursor control devices, a display, a network interface, and so forth. Examples of the bus 616 include but are not limited to a peripheral control interface (PCI) bus, an Industry Standard Architecture (ISA) bus, and so forth. In various embodiments, the system 600 may be a wireless mobile phone, a personal digital assistant, a pocket PC, a tablet PC, a notebook PC, a desktop computer, a set-top box, an entertainment unit, a DVD player, and a server.

While the present invention has been described in terms of the above-illustrated embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

What is claimed is:

1. A self-biased phase locked loop (PLL) circuit to generate an output signal having a target frequency based upon a reference clock signal, the PLL comprising:
    a charge pump to generate a control voltage;
    a controlled oscillator coupled to the charge pump to generate the output signal based at least in part upon the control voltage;
    discharge circuitry coupled to the charge pump to discharge the control voltage; and
    frequency detection circuitry coupled to the controlled oscillator and the discharge circuitry to generate a digital feedback signal for terminating discharge of the control voltage by the discharge circuitry when the output signal reaches a threshold frequency that is a fraction of the target frequency.

2. The self-biased PLL of claim 1, wherein the threshold frequency is programmably determinable.

3. The self-biased PLL of claim 1, wherein the controlled oscillator comprises a voltage controlled oscillator.

4. The self-biased PLL of claim 1, wherein the controlled oscillator comprises a current controlled oscillator.

5. The self-biased PLL of claim 1, wherein the frequency detection circuitry comprises a plurality of flip-flops sequentially coupled together such that an input signal applied to an input terminal of a first flip flop is asynchronously output from an output terminal of a last flip flop.

6. The self-biased PLL of claim 5, wherein a reference clock signal is coupled to a reset terminal on each of the plurality of flip flops and the output signal is coupled to a clock terminal on each of the plurality of flip flops.

7. The self-biased PLL of claim 6, wherein the digital feedback signal is output from the last flip flop and is coupled to the discharge circuitry.

8. The self-biased PLL of claim 7, wherein the digital feedback signal transitions from a first logic level to a second opposite logic level to facilitate termination of the control voltage discharge.

9. The self-biased PLL of claim 1, further comprising:
    bias circuitry coupled to the discharge circuitry and at least one of the charge pump and the controlled oscillator to generate an analog feedback signal to facilitate termination of the control voltage discharge prior to the target frequency being reached.

10. The self-biased PLL of claim 9, further comprising:
    a PFD coupled to the charge pump and the discharge circuitry to generate a control signal based upon one or more differences between a reference clock signal and a frequency divided feedback signal derived from the output signal, the control signal to facilitate termination of the control voltage discharge based upon a state of the control signal.

11. A system comprising:
    a communication bus;
    a DRAM coupled to the bus; and
    an integrated circuit (IC) coupled to the DRAM via the bus, the IC having a self-biased phase locked loop (PLL) to generate an output signal having a target frequency based upon a reference clock signal, the self-biased PLL including
        a charge pump to generate a control voltage;

a controlled oscillator coupled to the charge pump to generate the output signal based at least in part upon the control voltage;

discharge circuitry coupled to the charge pump to discharge the control voltage; and frequency detection circuitry coupled to the controlled oscillator and the discharge circuitry to generate a digital feedback signal for terminating discharge of the control voltage by the discharge circuitry when the output signal reaches a threshold frequency that is a fraction of the target frequency.

12. The system according to claim 11, wherein the integrated circuit further includes a central processing unit, a main memory coupled to the central processor unit and at least one input/output module coupled to the central processor unit and the main memory.

13. The system of claim 11, wherein the integrated circuit is a microprocessor.

14. The system of claim 11, further comprising a networking interface coupled to the bus.

15. The system of claim 11, wherein the system is a selected one of a set-top box, an entertainment unit and a DVD player.

16. The self-biased PLL of claim 11, wherein the threshold frequency is programmably determinable.

17. The self-biased PLL of claim 11, wherein the frequency detection circuitry comprises a plurality of flip-flops sequentially coupled together such that an input signal applied to an input terminal of a first flip flop is asynchronously output from an output terminal of a last flip flop.

18. An integrated circuit comprising:

a microprocessor;

a communication bus;

a DRAM coupled to the bus; and a self-biased phase locked loop (PLL) to generate an output signal having a target frequency based upon a reference clock signal, the self-biased PLL including discharge circuitry coupled to the charge pump to discharge a control voltage; and frequency detection circuitry coupled to the discharge circuitry to generate a digital feedback signal for terminating discharge of the control voltage by the discharge circuitry when the output signal reaches a threshold frequency that is a fraction of the target frequency.

19. The self-biased PLL of claim 18, wherein the threshold frequency is programmably determinable.

20. The self-biased PLL of claim 18, further comprising:

a charge pump to generate the control voltage; and a controlled oscillator coupled to the charge pump to generate the output signal based at least in part upon the control voltage.

* * * * *

UNITED STATES PATENT AND TRADEMARK OFFICE
CERTIFICATE OF CORRECTION

PATENT NO. : 6,919,769 B2  Page 1 of 1
APPLICATION NO. : 10/670828
DATED : July 19, 2005
INVENTOR(S) : Lim et al.

Figure 1:
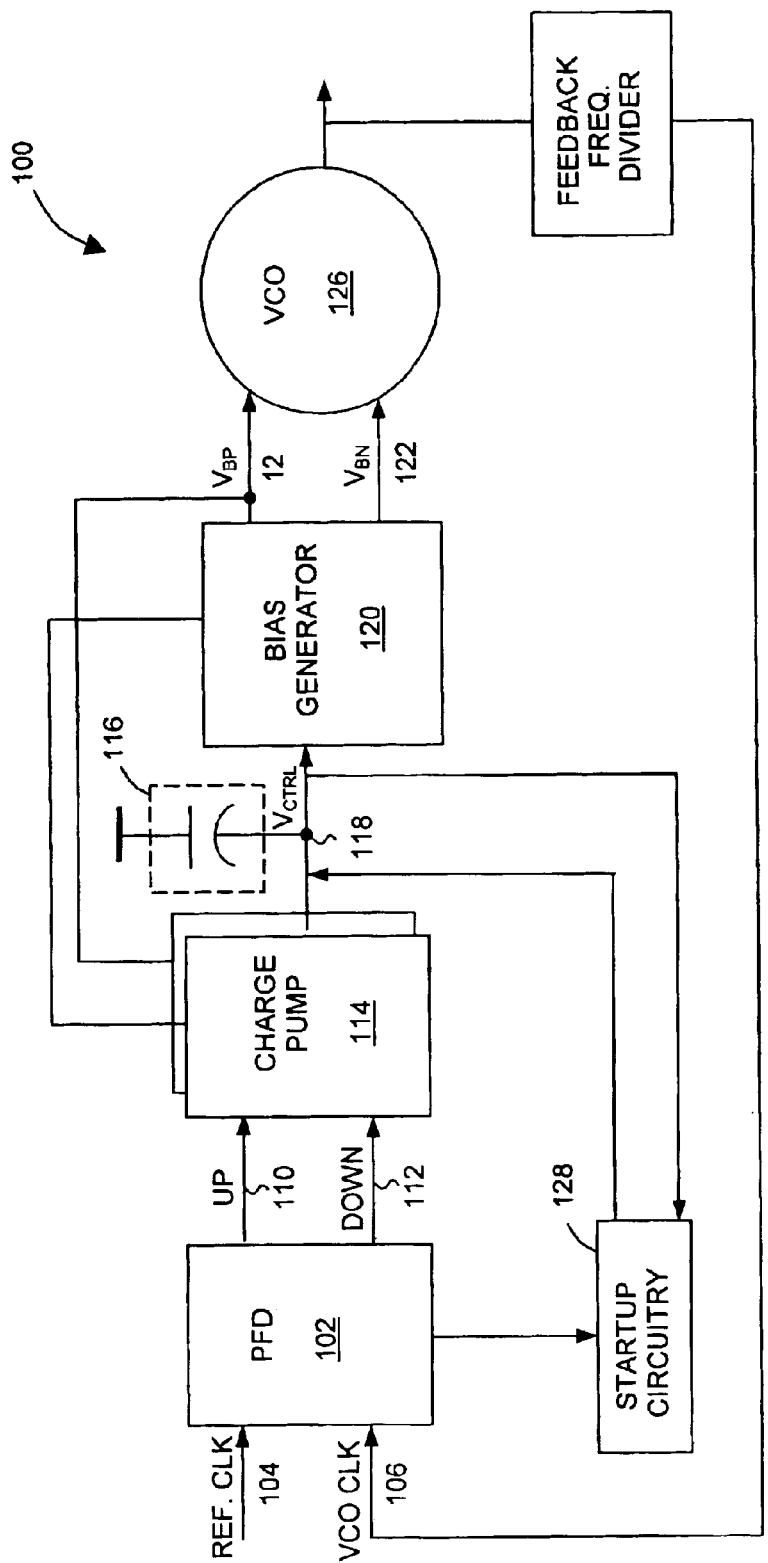
FIG. 1 illustrates a conventional self-biased phase-locked loop 100.

It is certified that error appears in the above-identified patent and that said Letters Patent is hereby corrected as shown below:

In the Drawings:
Fig. 1, "VBP/12" should read -- VBP/124--;
Fig. 6, "INPUT/OUTPUT DEVICE 614" should read --INPUT/OUTPUT MODULE 614--;

In the Claims:
Col. 1, line 52, "VCO 212." should read --VCO 126.--;
Col. 3, line 14, "... voltage of the VCO 212." should read --... voltage of the VCO 126.--;
Col. 4, line 52, "...of flip-flops 252a-252h are..." should read --...of flip-flops 452a-452h are... --;
Col. 5, line 22, "...of the VCO 212..." should read --...of the VCO 126...--;
Col. 5, line 55, "...input/output modules 614 include..." should read --...input/output module 614 include...--;
Col. 6, line 32, "...first flip flop is ..." should read --...first flip-flop is...--;
Col. 6, line 33, "...from an output terminal of a last flip flop." should read --... from an output terminal of a last flip-flop. --;
Col. 6, line 36, "...plurality of flip flops and..." should read --... plurality of flip-flops and...--;
Col. 6, line 37, "...plurality of flip flops." should read --... plurality of flip-flops.--;
Col. 6, line 38, "...last flip flop and..." should read --... last flip-flop and...--;
Col. 7, line 14, "...the central processor unit and..." should read --...the central processing unit ...--;
Col. 7, line 15, "...the central processor unit and the main memory." should read --... the central processing unit and the main memory.--;
Col. 8, line 1, "...first flip flop is..." should read --...first flip-flop is...--;
Col. 8, line 2, "...last flip flop." should read --...last flip-flop.--;

Signed and Sealed this

Twentieth Day of March, 2007

JON W. DUDAS
*Director of the United States Patent and Trademark Office*